(12) United States Patent
Dudek et al.

(10) Patent No.: US 7,422,840 B2
(45) Date of Patent: Sep. 9, 2008

(54) APPARATUS AND PROCESS FOR FORMING A PRINTING FORM HAVING A CYLINDRICAL SUPPORT

(75) Inventors: Dietmar Dudek, Langen (DE); Allan Banke, Nyborg (DK); Soren Michael Juul Jorgensen, Odense S (DK); Helmut Luetke, Frankfurt am Main (DE); Andreas Koch, Fuerstenfeldbruck (DE)

(73) Assignee: E.I. du Pont de Nemours and Company, Wilmington, DE (US)

( * ) Notice: Subject to any disclaimer, the term of this patent is extended or adjusted under 35 U.S.C. 154(b) by 380 days.

(21) Appl. No.: 11/269,096

(22) Filed: Nov. 8, 2005

(65) Prior Publication Data

US 2006/0104675 A1    May 18, 2006

Related U.S. Application Data

(60) Provisional application No. 60/627,222, filed on Nov. 12, 2004.

(51) Int. Cl.
*B41N 7/00* (2006.01)
*G03C 1/00* (2006.01)
*G03F 7/00* (2006.01)
*G03F 7/26* (2006.01)

(52) U.S. Cl. .............. 430/302; 101/456; 430/270.1; 430/273.1; 430/306; 430/935

(58) Field of Classification Search ............. 430/199, 430/302, 306
See application file for complete search history.

(56) References Cited

U.S. PATENT DOCUMENTS

| 5,279,697 A * | 1/1994 | Peterson et al. |
| 6,797,454 B1 * | 9/2004 | Johnson et al. |
| 2005/0211119 A1 * | 9/2005 | Markhart |
| 2005/0211120 A1 * | 9/2005 | Markhart |
| 2005/0211121 A1 * | 9/2005 | Vest et al. |
| 2005/0241509 A1 * | 11/2005 | Gotsick et al. |
| 2006/0029880 A1 * | 2/2006 | McMillen et al. ........ 430/199 |

* cited by examiner

*Primary Examiner*—Dah-Wei Yuan
*Assistant Examiner*—Chanceity N Robinson
(74) *Attorney, Agent, or Firm*—Thomas H. Magee

(57) ABSTRACT

The invention pertains to an apparatus and a process for forming a printing form from a photosensitive element having a cylindrical support, and in particular, to an apparatus and a process for thermally treating the photosensitive element to form a relief pattern and particularly to form a cylindrically-shaped flexographic printing form. The apparatus and process includes supporting the cylindrical support to accommodate thermal treating of photosensitive elements with various sizes of the cylindrical support.

58 Claims, 1 Drawing Sheet

APPARATUS AND PROCESS FOR FORMING A PRINTING FORM HAVING A CYLINDRICAL SUPPORT

BACKGROUND OF THE INVENTION

1. Field of the Invention

This invention pertains to an apparatus and a process for forming a printing form from a photosensitive element and, in particular, to an apparatus and a process for forming the printing form by a thermal development process and, more particularly, to an apparatus and a process for thermally developing a photosensitive element having a cylindrical support.

2. Description of Related Art

Flexographic printing plates are well known for use in relief printing on a variety of substrates such as paper, corrugated board, films, foils and laminates. Flexographic printing plates can be prepared from photosensitive elements containing a layer of a photosensitive composition such as those described in U.S. Pat. Nos. 4,323,637 and 4,427,759. Photosensitive compositions, which may be referred to as photopolymerizable compositions, generally contain an elastomeric binder, at least one monomer, and a photoinitiator. Photosensitive elements generally have the layer of the photopolymerizable composition interposed between a support and a cover sheet or multilayer cover element. Upon imagewise exposure of the photosensitive element to actinic radiation, photopolymerization of the photosensitive composition occurs in the exposed areas, thereby curing and rendering insoluble the exposed areas of the layer. Conventionally, the element is treated with a suitable solution, e.g., solvent or solvent mixture or aqueous-based solution, to remove areas of the photopolymerizable layer that were not exposed and leaving a printing relief which can be used for flexographic printing.

However, developing systems that treat the element with a solution are time consuming since drying for extended period (0.5 to 24 hours) is necessary to remove developer solution entrained in the element. In addition, developing systems that use solvent solutions also can produce volatile organic vapor as well as potentially harmful by-products as waste (both the solvent and any material carried off by the solvent) during development.

As an alternative to solution development, a "dry" thermal development process may be used which removes the unexposed areas without the subsequent time-consuming drying step. In a thermal development process, the composition layer, which has been imagewise exposed to actinic radiation, is contacted with an absorbent material at a temperature sufficient to cause the composition in the unexposed portions of the photosensitive layer to soften or melt and flow into an absorbent material. See U.S. Pat. Nos. 3,060,023 (Burg et al.); 3,264,103 (Cohen et al.); 5,015,556 (Martens); 5,175,072 (Martens); 5,215,859 (Martens) and 5,279,697 (Peterson et al.). The exposed portions of the composition layer remain hard, that is, do not soften or melt, at the softening temperature for the unexposed portions. The absorbent material collects the softened un-irradiated material and then is separated and/or removed from the composition layer. The cycle of heating and contacting the composition layer may need to be repeated several times in order to sufficiently remove the flowable composition from the un-irradiated areas and form a relief structure suitable for printing. Thus remains a raised relief structure of irradiated, hardened composition that represents the desired printing image.

Processors for thermal development of flexographic printing elements are known. U.S. Pat. No. 5,279,697 (Peterson et al.) describes an automated process and apparatus for heat treating an imagewise irradiated photosensitive sheet to remove unwanted portions and leave radiation hardened relief images on the sheet. PCT publication WO 2001/18604 also describes a method and apparatus for thermal processing a photosensitive element. In both thermal processing apparatuses an irradiated photosensitive printing element comprising the support and the composition layer is mounted on a drum and a continuous web of absorbent material is passed over a hot roll. The hot roll is urged towards the drum pressing the web against the photosensitive element and forming a nip. The hot roll may be heated by an electrical core heater or by other means to provide a temperature sufficient to melt a portion of the composition on the flexible film support. Heat is transferred by conduction from the hot roll, through the absorbent web, to the photosensitive element upon contact so the temperature of the composition layer is raised sufficiently to enable the unirradiated portions of the composition layer to liquefy and be absorbed into the absorbent material. As the drum and hot roll rotate in contact together, the web is pressed against the photosensitive element to absorb the liquefied unirradiated composition and is then separated from the element. Several cycles of passing the element past the hot roll are repeated to progressively remove the unirradiated composition from the printing element. After the unirradiated composition is removed the resulting element has a raised relief surface of hardened areas that is suitable use as a printing plate.

U.S. Pat. No. 5,279,697 describes heating the drum to preheat the composition layer to a temperature near the melt point of the unirradiated areas. But the heated drum may heat the support of the element to such an extent that the support may distort and/or shrink which can affect the dimensional stability of the relief area of the printing plate. WO 01/18604 avoids such undesirable distortion and/or shrinkage of the support by cooling the support simultaneous to the heating of the composition layer. Cooling of the support is carried out by blowing air on the circumferential surface of the drum while providing additional heat to an exterior surface of the composition layer with infrared heating devices.

Up to now, flat or planar photosensitive printing elements were typically processed in commercial thermal development processors. It was also possible to thermally process cylindrically-shaped photosensitive printing elements, such as seamless photopolymer sleeves, or so called plate-on-sleeves. Seamless photopolymer sleeves include at least a continuous or substantially continuous layer of the photopolymerizable composition on a cylindrical support. Plate-on-sleeves include a flat photosensitive printing element mounted onto a cylindrical support. But for each diameter of the sleeve possible for cylindrical printing elements either an extra support cylinder, i.e., drum or airshaft, needed to be fitted into the thermal processor, or the support cylinder needed to be fitted with a special adapter sleeve or sleeves. Replacement of the support cylinder in the thermal processor to accommodate different diameter sleeves is impractical since this would involve considerable downtime in the operation of the processor and cost in tooling for the processor.

So, thermal development of cylindrical photosensitive printing elements on sleeves with different diameters on commercial processors is difficult, time consuming, and expensive.

SUMMARY OF THE INVENTION

In accordance with this invention there is provided an apparatus for forming a printing form from a photosensitive element comprising a cylindrical support and a composition layer adjacent the support opposite an interior surface of the support, the composition layer capable of being partially liquefied. The apparatus includes a first means for supporting the photosensitive element by contacting a first part of the interior surface of the cylindrical support, a second means for supporting the photosensitive element by contacting a second part of the interior surface of the cylindrical support different from the first part, wherein the cylindrical support has one or more unsupported parts between the first part and the second part, and a means for treating an exterior surface of the photosensitive element opposite the support to form a relief surface in the element.

In accordance with another aspect of this invention there is provided a process for forming a printing form from a photosensitive element comprising a cylindrical support and a composition layer on the support opposite an interior surface of the support, the composition layer capable of being partially liquefied. The process comprising supporting the photosensitive element by contacting a first part of the interior surface of the cylindrical support with a first support member, and by contacting a second part of the interior surface of the cylindrical support different from the first part with a second support member, wherein the cylindrical support has one or more unsupported parts between the first part and the second part, and treating an exterior surface of the photosensitive element opposite the support to form a relief surface.

BRIEF DESCRIPTION OF THE DRAWING

The invention can be more fully understood from the following detailed description thereof in connection with the accompanying drawing described as follows.

DETAILED DESCRIPTION OF THE PREFERRED EMBODIMENTS

Figure 1:
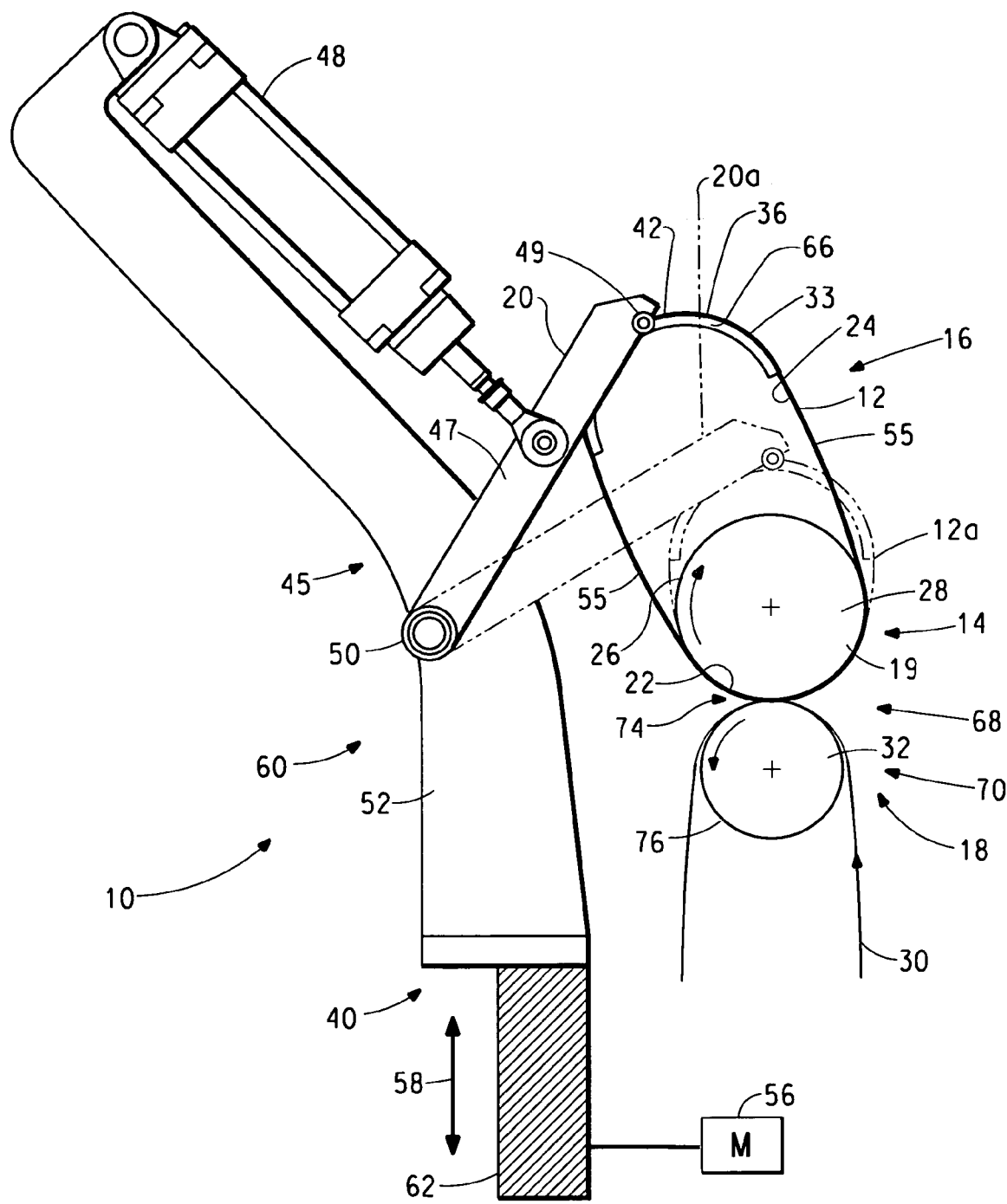
FIG. 1 is a schematic cross-sectional view of an embodiment of the apparatus of the present invention showing a first means for supporting a photosensitive element by contacting a first part of a cylindrical support of the element, a second means for supporting the element by contacting a second part different from the first part, and a means for treating an exterior surface of the element opposite the support with a development medium.

The present invention provides an apparatus and a process for forming a printing form from a photosensitive element having a cylindrical support and at least one composition layer capable of being partially liquefied on the support. The present invention contemplates an apparatus capable of heating the photosensitive element to a temperature sufficient to melt or soften or liquefy at least a portion of the composition layer. In particular, the apparatus and process thermally develop the element to create a relief structure suitable for printing with a flexographic printing form.

In accordance with the present invention the apparatus and process thermally develops photosensitive elements having an association with a cylindrical shape or substantially cylindrical shape. That is, the support for the photosensitive element itself may be cylindrical, or the photosensitive element may be grouped with at least one other structure that is cylindrically shaped. Since the resulting printing form is ultimately mounted onto a printing cylinder, the shape of the support or structure is generally cylindrical. However, the element may not be cylindrical or may only be substantially cylindrically shaped while in operative engagement in the present apparatus and process or when not mounted onto the printing cylinder. The cylindrically-shaped support or structure may also be referred to as a sleeve. The photosensitive element may include a continuous, seamless or substantially seamless, photopolymerizable composition layer adjacent to or on the cylindrically-shaped support. The photosensitive element can also encompass plate-on-sleeve system. Typically, plate-on-sleeve is a photosensitive element that includes at least the composition layer on a planar support, i.e., a plate, which is then mounted onto a cylindrically-shaped support. Ends of the plate may or may not meet or join when wrapped onto the sleeve. Plate-on-sleeve also includes an embodiment in which more than one plate, or portions of plates, are mounted onto a sleeve at various spaced locations. Also contemplated as the photosensitive element is a photosensitive plate having at least one photopolymerizable composition layer preferably on a base support, which is formed into a cylinder by butt joining both edges. The plate edges can be joined by any method including, but not limited to, melt fusing, taping, stitching, clamping, stapling, taping, gluing, and sewing. In this embodiment the base support would become the cylindrical support. Any of the embodiments described above may be referred to as cylindrical photosensitive elements or cylindrical printing forms. The photosensitive element includes a cylindrical support and a composition layer on or adjacent the support opposite an interior surface of the support. The cylindrical support has an axial length and an interior circumference that is the perimeter (length) of the interior surface.

The present invention provides an easy way to process cylindrical photosensitive elements having different diameters (that is, interior circumferences) on the same apparatus without the need for a specific support cylinder, i.e., drum, for each diameter. This provides considerable advantages in the reduction of tooling for the apparatus and the simplification of the thermal development process. In addition the use of special adapter sleeves for each diameter is not necessary, but an optional feature. Furthermore, the present invention provides an easy and economical way to prepare cylindrical printing forms with different repeat lengths from cylindrical photosensitive elements having different diameters. The repeat length of a particular cylindrical photosensitive element is the distance from start to end of an image region on a printed substrate before the image region is repeated on the printed substrate. The repeat length can also be considered a circumference of the exterior surface, that is the exterior perimeter (length), of the photosensitive element.

Processes for thermally developing the photosensitive element are disclosed by Peterson et al. in U.S. Pat. No. 5,279,697, and also by Johnson et al. in WO 01/18604. Both references show that the photosensitive element, i.e., a planar flexographic printing element, can be placed on a planar surface or on a drum for thermal treatment. But in contrast to these processes, the cylindrical photosensitive element thermally developed according to the present invention is not fully supported during thermal development. The cylindrical photosensitive element is only partially supported by a first support means and a second support means of the present apparatus. A feature of the present apparatus and process is that the cylindrical photosensitive element is not firmly fixed on a supporting cylinder, such as a drum, during thermal processing, but it is processed in a so-called "loose-fit" mode. In loose-fit mode, the interior surface of the cylindrical support of the photosensitive element is not fully contacted or supported by a supporting cylinder; and only a part or parts of the interior surface are in contact with or supported by a supporting means. That is, two or more parts of the interior surface circumference of the cylindrical support are contacted by or supported with the support means, such that the photosensitive element resides about the support means in a band-like fashion. The cylindrical support has between the supported parts one or more parts of the interior surface that are unsupported. Although one skilled in the art would expect that incomplete support of a cylindrical photosensitive element during thermal development would result in defects in the printing form and/or in its relief surface, the present apparatus and process surprisingly provides flexographic printing forms with a printing surface without defects caused by insufficient development or deformation of the relief surface. The loose fit mode is particularly useful for thermal processing of photosensitive elements in which the cylindrical support is a flexible sleeve and includes a continuous photopolymerizable layer on the sleeve.

FIG. 1 is a schematic illustration of the apparatus 10 for forming a printing form from a cylindrical photosensitive element 12 in accordance with the invention. For simplicity the cylindrical support, cylindrical photosensitive element, and the cylindrical element will all be referred to as feature 12. The apparatus 10 of the present invention includes a first means for supporting 14 the photosensitive element 12, a second means for supporting 16 the photosensitive element, and a means for treating 18 an exterior surface 19 of the photosensitive element 12 opposite the support. FIG. 1 depicts thermal processing of two cylindrical photosensitive elements 12 and 12a each having a different diameter (that is, a different interior circumference) on the same apparatus 10 without the need for a separate support drum for each element. The second supporting means 16 is in a first position 20 to support a first cylindrical photosensitive element 12 and shown in phantom the second supporting means 16 is in a second position 20a to support a second cylindrical photosensitive element 12a. The interior circumference of the cylindrical support for the first photosensitive element 12a is smaller than the interior circumference of the cylindrical support for the second photosensitive element 12.

The first means for supporting 14 the photosensitive element contacts a first part 22 of the interior surface 24 of the cylindrical support 12. A part 22 or segment of the interior circumference of the cylindrical support 12 is contacted by the first support means 14 to support or buttress the element while the softened, melted, or liquefied portions are being removed during treating. The first support means 14 includes an outer surface 26 having an arcuate shape that contacts the first part 22 of the interior surface 24 of the cylindrical support 12. The first support means 14 is not limited and can include, for example, a drum, a roller, a mandrel, and a platform member. In the embodiment shown the first support means 14 is a roller 28 mounted for rotation on a first sub-frame (not shown) of the apparatus 10. One end of the roller 28 is secured in the first sub-frame and the other end of the roller can disengage from the sub-frame or a beam member, so that the roller cantilevers from the secured end for loading and unloading of the cylindrical support 12.

With the present apparatus and process, all repeat lengths between a minimum and a maximum repeat length can be thermally developed without any adapter sleeve, particularly for thin flexible photopolymer sleeves. However a greater maximum repeat length can be accomplished with the use of an adapter sleeve mounted onto the roller 28 of the first supporting means 14. The adapter sleeve can provide an alternative surface for the roller to aid in the development process.

The adapter sleeve also can provide a resilient or compressible surface that assists in relief formation in the photosensitive element. In one embodiment, the roller 14 is an air-shaft having radial passages for supplying air to the outer surface 26 of the roller. The air supplied to the outer surface 26 facilitates movement of the optional adapter sleeve axially along and rotationally about the roller 28. The apparatus may include a pneumatic system that in one embodiment is connected typically to an end of the air-shaft to supply the air from a pressurized air source or generator to a cavity in the roller 28 and through the passages to the outer surface 26. It is well within the skill of the art to contemplate alternate embodiments of supplying air to the outer surface 26.

The optional adapter sleeve is mounted onto the air-shaft the same way or similar to the mounting of a printing sleeve or a bridge sleeve onto a printing cylinder. The air at the outer surface of the air-shaft creates a cushion that expands the adapter sleeve to the extent that the sleeve can slide along and rotate about a longitudinal axis of the roller. Once the adapter sleeve is in position on the air-shaft, the air supply is turned off and the sleeve contracts to have an interference fit with the roller. When the adapter sleeve is in use for thermal development, the interior surface of the cylindrical photosensitive element contacts an outermost surface of the adapter sleeve. The adapter sleeve should have a uniform thickness and is not limited to any particular structure. Any sleeve or bridge sleeve suitable for use on printing cylinders may be used as the adapter sleeve. In one embodiment the adapter sleeve is a thin support sleeve having a total thickness of 10 to 15 mm, and preferably 12 to 14 mm. In another embodiment the adapter sleeve includes on its outer surface a layer of a compressible material, preferably a layer of resilient material, such as, for example polyurethane foam. The compressible layer or resilient layer preferably has a thickness up to 6 mm, most preferably up to 3 mm.

In an alternate embodiment, the outer surface 26 of the first support means 14, that is the roller 28, may be modified or include one or more layers to provide additional functionality to the outer surface, such as resiliency, tackiness, protection, etc. The additional layer as a resilient layer can be composed of any material to suitable to provide a Shore A hardness between about 30 and about 75, such as natural rubbers and elastomeric materials and synthetic rubbers and elastomeric materials, including rubber, silicone rubber, and compressible foams. Particularly preferred are silicone rubber and rubber. The hardness of the layer is important, although not critical to the invention. The resilient surface provided by the resilient layer can result in a longer nip zone as a result of the surface deflecting under the pressure exerted by the treating means. The rubber elasticity also accommodates some minor misalignment between the roller and the treating means. The resilient layer can include metal particles, such as aluminum particles, to improve the heat transfer characteristics of the roller.

In one embodiment, the roller 28 or air shaft is rotated so that a speed of the surface of the photosensitive element 12 (surface speed) is synchronized to a speed of a web of a development medium 30 in contact with the photosensitive element 12. The roller 28 supporting the cylindrical photosensitive element 12 and a heated roll 32 delivering the development medium 30 are independently driven by motors (not shown) to avoid inducing high shear or slip conditions on the surface of the photosensitive element. Alternate configurations are possible in which the heated roll 32 is not driven. The development medium 30 is pulled through (from unwind, passing over heated roll, to windup) the apparatus. The speed of the web of the development medium 30 is regulated by drive rollers that are past the transfer nip point and the tension of the web entering the nip is controlled by means of braked rollers upstream of the transfer nip point. In alternate embodiments of the first support means 14 that do not rotate, such as a platform member, it is within the skill of those in the art to include comparable means to synchronize the surface speed of the photosensitive element 12 with the speed of the web of the development medium 30.

The second means for supporting 16 the cylindrical photosensitive element contacts a second part 33 of the interior surface 24 of the cylindrical support 12. The second part 33 is different from the first part 22 of the interior surface 24. The part 33 or segment of the interior circumference of the cylindrical support 12 is contacted by the second support means 15 to support or tension the element during treating. The second support means 16 includes an outer surface 36 having an arcuate shape that contacts the second part 33 of the interior surface 24 of the cylindrical support 12.

The second support means 16 is not limited and can include for example, a drum, a roller, a mandrel, and a platform member. The second support means 16 is mounted on a carriage assembly 40 on the first sub-frame (not shown) of the apparatus. In one embodiment the second support means 16 is a roller that is mounted for rotation on the carriage assembly 40. In the embodiment shown, the second support means 16 is a platform member 42 having a cross-sectional arcuate shape providing an arcuate outer surface 36. When the cylindrical photosensitive element is in place for thermal development, the second part 33 of the interior surface 24 of the cylindrical support 12 contacts the arcuate surface 36 of the platform member 42.

The platform member 42 can be unitary and have a fixed curvature of its arc as shown. This embodiment is particularly suited for flexible cylindrical supports 12 that can readily conform to the arcuate shape of the platform member 42. Alternatively the platform member 42 can be segmented in at least two parts. The segmented parts may be flexibly coupled together, by for example a flexible band, to allow the platform member 42 to change the curvature of its arc. A segmented platform member 42 is particularly useful for thermally developing photosensitive elements that include a "stiff" cylindrical support. The segmented platform member 42 can better conform to the inner surface of the cylindrical support, increasing the contact of the outer surface of the platform member to the cylindrical support and thus facilitating the control of the position of the cylindrical support. A stiff cylindrical support is any support that does not sufficiently flex or conform to a fixed curvature of the platform member. Stiff cylindrical supports may have one or more factors which prevent or reduce its ability to conform to a different arcuate shape, such as, but not limited to, its wall thickness, its diameter, and materials of construction. For example, a cylindrical support formed of glass fiber reinforced resin and/or having a wall thickness on the order of 600 micron can be stiff enough not to conform to the arcuate shape of the platform member (and roller) when in operating position in the present apparatus. One or more of the segments of the segmented platform member, or the flexible band may include a cavity for temperature controlling fluids to traverse.

The outer surface 36 of second support means 16 in its entirety or in part may be provided with a material that reduces friction, such as TEFLON® fluoropolymer. Contact of the interior surface 24 of the cylindrical support 12 with the outer surface 36 of the second support means 16 can cause friction that may prevent or inhibit rotation of the cylindrical element during thermal development. The friction-reducing material (i.e., an anti-stick material) allows for the cylindrical support 12 to easily traverse the outer surface of the second support means 16 during thermal development.

The interior surface 24 of the cylindrical support 12 contacts at least a portion of the outer surface 36 of the second support means 16, and preferably the interior surface contacts the entire outer surface of the second support means. Contact between the interior surface 24 and the outer surface 36 should be sufficient to help to manage the temperature of the cylindrical element 12 and to control the movement of the cylindrical support during thermal development. For instance during thermal development, it may be beneficial to keep the temperature of the cylindrical support lower than the temperature of the composition layer, to minimize or prevent distortion of the cylindrical support. Distortion can come about when there is a mismatch between the shrinkage characteristics of the cylindrical support and the temperature the composition layer must be raised to for thermal development in the process. A support with a high shrinkage (or low dimensional stability) at the developing temperature of the composition layer must be maintained at a temperature much less than the developing temperature of the composition layer during the heating process. It may also be beneficial to maintain the temperature of the photosensitive element so that its temperature does not increase beyond the temperature necessary for development. Contact between the cylindrical support 12 and the second supporting means 16, particularly when the second supporting means includes a means for cooling, helps to effectively remove heat retained in the photosensitive element and maintain the element at desired developing temperature/s. Further, it is desirable to maintain sufficient contact between the interior surface 24 of the cylindrical support 12 and the outer surface 36 of the second supporting means 16, in order to eliminate or reduce any forces causing lateral movement of the cylindrical element along the first supporting means 14, i.e., the roller 28, and/or the second supporting means 16, i.e., the platform member 42.

The present apparatus determines the minimum and maximum perimeter (length) of the interior surface 24 of the photosensitive element 12 that can be thermally developed. The minimum size of the interior perimeter of the element is determined from the length of the outer surface of the first support means, such as a circumference of the roller. The maximum size of the interior perimeter of the element is determined by the total distance from the outermost position of the outer surface of the second support means and to the outer surface of the first support means outermost from the second support means.

In the embodiment shown, the apparatus 10 includes a means for moving 45 the second means for supporting 16. The means for moving 45 moves the second support means 16 into position for loading and unloading of the photosensitive element 12 from the apparatus 10 and for supporting in tension the cylindrical support for thermal development. The means for moving 45 can also be considered a means for tensioning the cylindrical support 12 between the first support means 14 and the second support means 16. For thermal development the means for moving 45 positions the second support means 16 to extend the cylindrical support 12 into a non-cylindrical shape and hold taut the cylindrical photosensitive element in relative tension between the first support means 14 and the second support means 16.

The means for moving 45 includes a moving assembly that comprises at least an arm 47 and an actuating device 48. An arm 47 is coupled at each axial end of the second support means 16, that is the platform member 42 in FIG. 1. One axial end of the platform member 42 is demountably coupled to one end of a first arm 47 with a removable fastener such as a screw or locking pin. The opposite axial end (not shown) of the platform member 42 is attached to one end of a second arm. For loading and unloading of the cylindrical support 12, the first arm 47 uncouples from the platform member 42 by removing the fastener 49 and pivots away from the platform member. The platform member 42 cantilevers from the attached end of the second arm while the cylindrical support 12 is mounted or dismounted from the apparatus 10. For both the first arm 47 and second arm, an end 50 of the arm 47 opposite the end coupled to the second support means 16 is pivotally connected to a carriage 52 of the carriage assembly 40. The arm 47 is mounted so that the arm can pivot about and position the platform member 42 to accommodate different photosensitive elements 12 of different diameters. Between the two ends, the first arm 47 is coupled to an end of the actuating device 48. Similarly, the second arm is coupled to an end of a second actuating device. The actuating devices 48 operate in tandem to move the second supporting means 16. Although it is within the skill of those in the art to provide alternate embodiments of the means for moving 45 the second supporting means 16, the embodiment described provides easy access to the entire axial length of the second supporting means for mounting and dismounting of the cylindrical support 12.

In FIG. 1, the arm 47 is shown in two positions, one position 20 which tensions a first photosensitive element 12 having large diameter (or internal circumference) between the first support means 14 and the second support means 16, and in a second position 20a (shown in phantom) which tensions a second photosensitive element 12a of a smaller diameter between the first support means 14 and the second support means 16.

An end of the actuating device 48 opposite the arm 47 is coupled to an end of the carriage 52. The actuating device 48 is not limited and can include linear actuators, such as pneumatic or hydraulic cylinders, or stepping motors. The actuating device 48 moves the arm 47 positioning the second support means 16 sufficiently close to the first support means 14 so that the cylindrical photosensitive element 12 can be loaded onto (or unloaded from) the first and second supporting means. The second support means 16 is sufficiently close when the interior circumference 24 of the cylindrical support 12 is larger than the sum of a length (arc) of the outer surface 26 of the first supporting means 14 that would contact the cylindrical support, a length (arc) of the outer surface 36 of the second supporting means 16 that would contact the cylindrical support, and a total length of any gaps intervening between the first and second supporting means 14, 16. In the load and unload positions the cylindrical support 12 surrounds the first and second supporting means 14,16 and possibly a part of the interior surface 24 of the cylindrical support contacts the outer surface 36 of the second support means 16. The cylindrical photosensitive element 12 is readied for thermal development when the actuating device 48 moves the arm 47 and the second support means 16 away from the first support means 14 so that the cylindrical photosensitive element is held relatively taut between the first and second supporting means. The first part 22 of the interior surface 24 of the cylindrical support 12 contacts at least a portion of outer surface 26 of the first supporting means 14 and, the second part 33 of the interior surface 24 of the cylindrical support different from the first part 22 contacts at least a portion of the outer surface 36 of the second supporting means 16. The first part 22 and the second part 33 of the interior surface 24 of the cylindrical support 12 are opposite or substantially opposite each other. The cylindrical support 12 is held relatively taut between the first and second supporting means 14,16 because the interior surface 24 of the cylindrical support has unsupported parts 55 between the first and second parts 22,33 that are not contacted by the first and second support means 14,16, and thus the element is in loose-fit mode on the apparatus 10. The pressure in the actuating cylinder/s 48 can be controlled during thermal development to assure that the second support means 16 maintains constant or substantially constant tension in the cylindrical support 12 while minimizing mechanical stresses on the element and accounting for thermal expansion of the element. Maintaining tension on the cylindrical support 12 helps to avoid transverse (lateral) movement of the cylindrical support along the longitudinal axis of the first support means 14, that is the roller 28. The pressure in the actuating devices 48 is set so as to maintain contact of the interior surface 24 of the cylindrical support 12 with the outer surface 36 of the second supporting means 16, but not so high as to as to distort the cylindrical support or element at the elevated temperatures associated with thermal development. For instance, the pressure for an air cylinder having a 3 inch diameter is between 1 and 2 bars. It should be understood that during thermal development the first part 22 and second part 33 can be a different part of the interior surface 24 from one instant of time to the next since the cylindrical support 12 rotates about the first and second support means 14,16.

The carriage assembly 40 is secured to the first sub-frame of the apparatus 10 and includes the carriage 52 and an actuator or actuating mechanism 56. The carriage 52 is an upright beam mounted for movement onto the actuator or actuating mechanism 56. The second means for supporting 16 and the means for moving 45 are mounted onto the carriage assembly 40. Although not shown in FIG. 1, the first means for supporting 14 is also mounted onto the carriage assembly 40. The actuator or actuating mechanism 56 moves the carriage beam 52 vertically or substantially vertically, according to arrow 58, carrying the first support means 14 and the second support means 16 to position the cylindrical photosensitive element 12 adjacent to the treating means 18 for thermal development and to position the element away from the treating means for loading and unloading of the element. In one embodiment, the carriage assembly 40 is a means for delivering 60 the photosensitive element 12 to the treating means 18, and particularly to the development medium 30. On each side of the carriage beam 52, an end opposite the actuating device 48 is mounted onto a spindle 62 driven with a motor (not shown) to rotate the spindle and thereby raise and lower the carriage beam.

An alternate embodiment is also contemplated in which the apparatus 10 includes a means for moving the first means for supporting 14. In one embodiment, the means for moving the first support means 14 can be used by itself, that is, the means for moving can position the first support means to load and unload the cylindrical support 12 and to tension the cylindrical photosensitive element as was described above for the means for moving 45 the second support means 16. The second support means 16 would remain stationary during these operations. In an alternate embodiment, the means for moving the first support means 14 can be used in conjunction with the means for moving 45 the second support means 16 for quicker positioning of the first and second support means. The means for moving the first support means 14 can be similarly mounted to the carriage assembly 40 as was described above. It is well within the skill of those in the art to contemplate alternative means for moving the first support means 14, the second support means 16, or both the first and second support means to accomplish loading and unloading of the cylindrical support and tensioning of the cylindrical photosensitive element.

The apparatus 10 may include at least one means for changing a temperature (not shown) of the first support means 14 and/or a temperature of the second support means 16. In particular, the means for changing alters the temperature of the outer surface 26 of the first support means 14 and/or the temperature of the outer surface 36 of the second support means 16. Thermal development heats the cylindrical photosensitive element 12 to a development temperature or temperature range suitable for the uncured portions of the composition layer to liquefy, i.e., melt or soften or flow. It may be necessary to change the temperature of each of the first and second support means 14,16 in order to establish and/or maintain the cylindrical photosensitive element 12 at the desired the development temperature or temperature range. Depending upon various factors including but not limited to the thermal inertia of the material making up the photosensitive element, the desired development temperature or temperature range, the forming relief structure, the thermal development cycle, it may be necessary to heat or cool the cylindrical element to attain desired characteristics. The means for changing 64 the temperature can include a means for heating, a means for cooling, or a means for heating and cooling. The first supporting means 14 and the second supporting means 16 each may include a cavity interior to the structure, and preferably adjacent to a wall forming the outer surface 26,36, where the means for changing 64 the temperature may be located. Means for heating may be provided to keep the cylindrical photosensitive element 12 at a stable starting temperature independent of the surrounding environment, or to pre-heat the element in preparation for thermal development. Any means for heating, such as a heater or an electrical heating blanket, is acceptable so long as the power capacity of the heater is sufficient to maintain the temperature of the outer surface fairly constant. Means for cooling may be provided to maintain the photosensitive element 12 at a relatively stable temperature during thermal development. The means for cooling is not limited and can include forced circulating fluids, such as water or oil, through the cavity. Although not preferred cooling gases, such as air, can be used but offer limited capacity to cool and remove heat from the system. In one embodiment, water is particularly effective to be circulated through the cavity to accomplish heating and/or cooling. In a preferred embodiment, cool water is circulated through a cavity 66 in the platform member 42 and a cavity in the roller to maintain the temperature of the cylindrical photosensitive element 12 during thermal development and/or to sufficiently cool the cylindrical support to reduce or eliminate thermal distortions to the support. While it may be useful, and perhaps even necessary under some circumstances to heat the first supporting means 14 and/or the second supporting means 16, the preferred embodiment cools at least the second supporting means. The apparatus 10 may include a temperature control system, such as a thermostat for the cooling or heating fluid, as a means to control the temperature of the first and second supporting means 14,16.

The present apparatus 10 further includes the means for treating 18 the exterior surface 19 of the photosensitive element 12 by heating to a development temperature suitable for the uncured portions of the composition layer to liquefy, i.e., melt or soften or flow. The uncured portions can be removed from the cured portions of the composition layer by any means including air or liquid stream under pressure as described in U.S. publication 2004/0048199 A1, vacuum as described in Japanese publication 53-008655, and contacting with an absorbent material as described in U.S. Pat. Nos. 3,060,023; 3,264,103; 5,015,556; 5,175,072; 5,215,859; 5,279,697; and 6,797,454.

In one embodiment, the means for contacting 68 the development medium 30 to an exterior surface 19 of the photosensitive element 12 opposite the support may be accomplished by the means for delivering the photosensitive element to the development medium. In this embodiment, the means for delivering is the carriage assembly 40. In an alternate embodiment, the means for contacting 68 may be accomplished by a means for supplying 70 the development medium 30 to the photosensitive element 12. In yet another embodiment, the photosensitive element 12 and the development medium 30 can be brought into contact by both the means for supplying and the means for delivering.

In one embodiment, the means for supplying 70 the development medium 30 is the roll 32 carrying the medium to the exterior surface of the photosensitive element. The roll 32 is mounted for rotation in a second sub-frame (not shown) of the apparatus 10 and located adjacent the first supporting means 14. In one embodiment, the roll 32 does not move relative to the first means for supporting 14 and the means for delivering, that is the carriage assembly 40 moves the first supporting means 14 toward the development medium 30. In an alternate embodiment, the means for supplying 70 the development medium 30 can be accomplished, for example, by mounting the roll 32 onto arms attached to a beam that moves the roll under the urging of one or more actuators. Alternative means for moving the roll 32 to supply the development medium 30 is well within the skill of those in the art. Suitable for use as one or more actuators can be air cylinders, or stepping motors, or servo motors. When the development medium 30 and the exterior surface 19 of the photosensitive element 12 are brought into contact by the means for contacting a nip 74 is formed between the roll 32 and the roller 28.

In FIG. 1 the means for supplying 70 the development medium 30 is the heated roll 32 or hot roll that supplies a continuous web of the development medium to the photosensitive element 12. The hot roll 32 maintains or further elevates the temperature of the exterior surface 19 of the composition layer. The hot roll 32 thus also functions as a means for heating the photosensitive element 12 as well as a means for supporting the development medium 30. As the continuous web of the development medium 30 passes over the hot roll 32, the temperature of the element 12 is rapidly elevated to a temperature that exceeds the melt temperature of the composition layer. In a preferred embodiment, heat is provided to the hot roll 32 by a core heater, such as a cartridge heater. The core heater is selected to have dimensions and power to provide sufficient energy to maintain a skin temperature of an outer surface of the hot roll 32 to melt a portion of the composition layer through the web. Typically the skin temperature is between about 120 to 200° C., and preferably between 140 and 170° C. Alternate embodiments contemplated to heat the hot roll 32 include the use of steam, oil, hot air, and a variety of other heating sources to provide a skin temperature sufficient to melt a portion of the composition layer through the web. The hot roll 32 is preferably metal having an outer surface that may be coated with a layer of an elastomeric material. The hot roll 32 may be crowned, that is a diameter of the roll increases from side edge to center, or may be a straight roll. If the hot roll 32 is a straight roll, the hot roll may optionally be supported on its backside, i.e., the side opposite the nip, with one or more heat resistant rollers to counter possible deflection of the straight roll along the nip, particularly when in pressing contact with the photosensitive element.

In one embodiment, the hot roll 32 is driven by friction between its outer surface 76 and the continuous web 30 contacting the hot roll. In an alternate embodiment, the hot roll 32 and roller 28 are each independently driven with a servomotor in order to synchronize a linear speed of the exterior surface of the photosensitive element on the roller and a linear speed of the web transporting on the outer surface of the hot roll. In this embodiment the linear speed of the hot roll, the web, and the photosensitive element be substantially the same to avoid or minimize any shear stress on the element. Such stress may cause uneven relief depth and a distorted image, which are undesirable.

The continuous web of development medium 30 is unwound from a supply roll, guided over the hot roll 32, and wound up on a take-up roll. The apparatus 10 may include one or more additional rolls to transport, guide, idle and/or tension the continuous web 30 as necessary through the processor. The web of the development medium 30 may be under tension control, velocity control, or a combination thereof for transport through the processor. In one embodiment a means for applying tension (not shown) to the development medium 30 includes drive roll having an abrasive outer surface to prevent slippage of the web and a torque motor that provides constant torque to the drive roll so as to apply a constant or substantially constant tension to the web. The tension required to remove the web from the element may change with each cycle or subsequent cycles of removing for a given photosensitive element. As such, a controller (not shown) for the torque motor can adjust the torque so that the tension in the web is accordingly changed. In an alternate embodiment, the processor may include a motor to pull the web 30 through the processor at a linear speed that is synchronized with a linear speed of the outer surface 19 of the element 12 on the roller 28. It is well within the skill of those in the art to contemplate alternative embodiments and include necessary components to accomplish desired control of the web transport through the processor. The supply roll, take-up roll, and the one or more additional rolls can be mounted for rotation on a frame of the processor or on the second sub-frame. The second sub-frame can be movable so that it can be rolled out of the frame of the processor when required for servicing.

The present apparatus 10 also include pressure means for causing the cylindrical photosensitive element 12 and the development medium 30 to come into contact at a pressure sufficient for at least a portion of the liquefied material of the composition layer to be absorbed by the development medium. When the hot roll 32 is adjacent the first supporting means 14, the nip 74 is formed between the photosensitive element 12 and the hot roll 32 with the development medium 30 between the element and the hot roll. The nip 74 is the location where the hot roll 32 carrying the web contacts the exterior surface 19 of the photosensitive element 12 supported by the roller 28. It is desirable to apply a uniform or substantially uniform pressure at the nip 74 across the width of the element 12 during processing. This uniform pressure assumes that the image across the nip is uniform; those skilled in the art will recognize that the pressure applied will vary locally as image elements pass through the nip. Pressure is applied to force the absorbent web into intimate contact with the photosensitive element. Pressure between about 0.70 kilograms per square centimeter and about 24 kilograms per square centimeter, preferably between about 2 kilograms per square centimeter and about 12 kilograms per square centimeter in the nip area is adequate to enhance the absorption from the element surface to the absorbent web without distorting the composite photosensitive element.

Alternative embodiments of the means for supplying 70 the development medium 30 such as those described as a means for supporting in U.S. Non-provisional application Ser. No. 11/193,224, filed Jul. 29, 2005 are also contemplated. The means for supplying 70 can include embodiments in which a support member has a non-rotating surface that supports the development medium 30 in contact with the exterior surface 19 of the photosensitive element 12. The non-rotating surface of the support member has advantages as it reduces the costs and simplifies the manufacture, operation, and maintenance of the apparatus as well as the method of using the apparatus. The support member has a cross-sectional shape that is not limited, and can include, for example, elliptical, arcuate including convex and concave surfaces, parabolic, circular, semi-circular, wedge, triangular, rectangular, and other polygonal shapes. The shape of the support member can be symmetrical or asymmetrical. The support member may be solid or may include a cavity (not shown) to accommodate sources of heating the support member or for circulating a heated fluid. The support member can also have the cavity to minimize its weight and/or to minimize its thermal mass so as to have more rapid response to temperature changes or to minimize heat losses in undesired locations. The material/s of constructing the support member is not limited, and include, but are not limited to, sheet metal, cast metal, machined metal, alloys, polymer composite materials, thermoplastic materials, thermoset materials, and combinations thereof. The material chosen for the support member should be resistant to thermal distortion at the temperatures associated with thermal processing, and be able to resist displacement, i.e., bending and torsion, under the operating forces in the process.

Means for providing relative movement can be accomplished by moving any one of or a combination of the first supporting means 14, the second supporting means 16, and the treating means 18 towards and/or away from each other in order for thermal development to occur. Preferably the first and second supporting means 14,16 are movable independently of each other. The carriage assembly 40, the means for moving 45 the second supporting means 16, and the means for contacting 68 the photosensitive element 12 and the development medium 30 (which can include the means for delivering the photosensitive element, and the means for supplying the development medium) can be considered means for providing relative movement. Alternative means for providing relative motion between the photosensitive element and the development medium are described in U.S. Pat. No. 5,279, 697 (Peterson et al.) and WO 2001/18604.

Furthermore, the present apparatus 10 may include at least one additional heating means for heating the exterior surface 19 of the photosensitive element 12 to a temperature sufficient to cause at least a portion of the layer to liquefy. The additional heating means (not shown) applies heat to the exterior surface 19 of the photosensitive element 12 opposite the support, (that typically is the composition layer) prior to means for removing the uncured portions. In one embodiment, the additional heating means is adjacent to the contacting means 68 where the development medium 30 contacts the photosensitive element 12. Preferably, infrared heating devices can be used as the additional heating means.

Temperature sensors may be mounted throughout the processor to monitor the temperature for the purpose of controlling the temperature of the heating and/or cooling elements in the first supporting means, the second supporting means, the treating means, and radiant heater.

The first means for supporting 14 and the second means for supporting 16 are on the first sub-frame of the apparatus 10.

The means for treating 18 including at least the hot roll 32 is on the second sub-frame of the apparatus 10. Each sub-frame is a removable module within the apparatus, such that essential elements of the apparatus can be quickly exchanged, and provide increased versatility to the apparatus. Each module can be exchanged with a backup module carrying the same essential elements for situations where the module needs maintenance or improvements, or with alternate modules carrying essential elements for processing different types of cylindrical elements.

The operation of the process for thermally developing the cylindrical photosensitive element will be explained relative to the embodiment shown in FIG. 1. The process begins with placing the photosensitive element 12 that has been imagewise exposed about the first supporting means 14 (the roller 28) and the second supporting means 16 (the arcuate platform member 42). The means for moving 45 the platform member 42 is actuated to bring the platform member sufficiently close to the roller 28 so that the interior circumference of the cylindrical support 12 can fit about the platform member and the roller. One axial end of the platform member 42 is decoupled from the arm 47 by removing the removable fastener 49. The arm 47 is moved away and the platform member 42 cantilevers from its opposite end. Similarly, the same end of the roller 28 as the decoupled end of the platform member 42 is decoupled from the sub-frame, to cantilever the roller from its opposite end. If the optional adapter sleeve is to be used, the air to the roller is turned on, the adapter sleeve is slid over the roller, and the air is turned off. The cylindrical support 12 is axially slid over the platform member 42 and the roller 28. The roller 28 end support extending from the sub-frame is re-attached. The arm 47 is returned its coupling position with the platform member 42, and the fastener 49 is secured. The actuator 48 of the means for moving 45 moves the arm 47 and the platform member 42 away from the roller 28 until the cylindrical support 12 is tensioned between the platform member and the roller. In the tensioned position, the cylindrical support 12 is extended and held relatively taut into contact against the outer surface 36 of the platform member 42 and the outer surface 26 of the roller 28 opposite the platform member. When the photosensitive element 12 is in position for thermal development in the present apparatus 10, the first part 22 of the interior surface 24 of the cylindrical support 19 is in contact with at least a portion of the outer surface 22 of the first support means 14, and the second part 33 of the interior surface 24 of the cylindrical support 12 is in contact with at least a portion of the outer surface 36, e.g., arcuate surface, of the second support means 16. Also the cylindrical support 12 has one or more parts 55 of the interior surface 24 between the first part 22 and the second part 33 that are unsupported, that is; not contacted by one of the support means 14, 16. The means for changing 64 the temperature of one or more of the first and second supporting means 14, 16 may be turned on to allow water to transport through the cavity 66 of the platform member 42 and/or the roller 28 to (pre-) heat the cylindrical support 12. The additional heating means, the radiant heater (not shown), may also be turned on to (pre-) heat the exterior surface 19 of the cylindrical photosensitive element 12. The radiant heater may preheat the bulbs before the element is near the heater, and then switch to an operating setting to achieve the desired temperature for melting the composition layer on element. The heater in the hot roll 32 is turned on to warm the outer surface 76 of the hot roll to the desired developing temperature. The servomotors in both the roller 28 and the hot roll 32 are turned on. The cylindrical photosensitive element 12 begins its rotation about the platform member 42 and the roller 28, and the continuous web 30 begins transport through the nip 74 rotating with the hot roll 32 at the same or substantially the same linear speed as the photosensitive element 12. The motor of the carriage assembly 40 is turned on to move the carriage 52 and position the exterior surface 19 of the element 12 into pressure contact with the development medium 30 residing on the hot roller 32. The composition layer of the photosensitive element is heated to between 40 and 230° C. (104-392° F.) while in contact with the development medium 30. The development medium 30 contacts the exterior surface 19 of the composition layer of the heated photosensitive element 12, and absorbs the liquefied portions of the elastomeric polymer from the unirradiated (uncured) portions of the composition layer, forming a flexographic printing form in which portions are removed to form a relief pattern or surface. By maintaining more or less intimate contact of the development medium 30 with the composition layer that is molten in the uncured regions, a transfer of the uncured photosensitive material from the photopolymerizable layer to the development medium 30 takes place. Intimate contact of the development medium 30 to the photopolymerizable layer may be maintained by pressing the layer and the development medium together. The development medium 30 may be removed immediately after traversing the nip area 74. Optionally while still in the heated condition and at a location away from where the web 30 contacted the element 12, the development medium may traverse a peeling edge (not shown) that causes the web to change direction from traveling with the element to a substantially opposite direction, thereby removing the development medium from the exterior surface of the element. The cylindrical photosensitive element 12 continuously rotates about the platform member 42 and the roller 28 during thermal development to continuously cycle through heating the element, contacting the web 30 to the element, and removing the web from the element. The means for changing the temperature 64 may send cooling water through the platform member 42 and/or the roller 28 to maintain constant the temperature of the photosensitive element 12. The radiant heater may cool down or turn off. The cycle of the steps of heating the composition layer, contacting the molten (portions) layer with the development medium, and removing the development medium can be repeated as many times as necessary to adequately remove the uncured material from the composition layer and create sufficient relief depth. However, it is desirable to minimize the number of cycles for suitable system performance, and typically the photopolymerizable element is thermally treated for 5 to 15 cycles.

The Photosensitive Element

The first step of the present process is to provide a photosensitive element. The photosensitive element comprises at least one composition layer capable of being partially liquefied upon thermal development. That is, during thermal development the uncured composition must soften or melt or flow at a reasonable processing or developing temperature but not be subject to cold flow, i.e., dimensional change, during normal storage. Preferably, the photosensitive element is an elastomeric printing element suitable for use as a flexographic printing form. The composition layer is preferably a photosensitive layer, and most preferably a photopolymerizable layer of an elastomeric composition wherein the photosensitive layer can be selectively cured by actinic radiation. As used herein, the term "photopolymerizable" is intended to encompass systems that are photopolymerizable, photocrosslinkable, or both. Throughout this specification actinic radiation will include ultraviolet radiation and/or visible light.

A preferred example of an elastomeric composition comprises at least one thermoplastic elastomeric block copolymer, at least one monomer, and at least one photoinitiator or a photoinitiator system. Preferably, the thermoplastic elastomeric block copolymer is an A-B-A type block copolymer, where A represents a non-elastomeric block, preferably a vinyl polymer and most preferably polystyrene, and B represents an elastomeric block, preferably polybutadiene or polyisoprene. Suitable thermoplastic elastomeric binders of this type include poly(styrene/isoprene/styrene) block copolymers and poly(styrene/butadiene/styrene) block copolymers which are preferred. Mixtures of poly(styrene/isoprene/styrene) block copolymers and poly(styrene/butadiene/styrene) block copolymers are also suitable for use. The non-elastomer to elastomer ratio is preferably in the range of from 10:90 to 35:65. Most preferably the thermoplastic elastomeric binder is a mixture of at least two poly(styrene/isoprene/styrene) block copolymers as described by Dudek et al. in U.S. Pat. No. 5,972,565. It is preferred that the binder be present in an amount of at least 60% by weight of the photosensitive layer.

Other suitable photosensitive elastomers that may be used include polyurethane elastomers. An example of a suitable polyurethane elastomer is the reaction product of (i) an organic diisocyanate, (ii) at least one chain extending agent having at least two free hydrogen groups capable of polymerizing with isocyanate groups and having at least one ethylenically unsaturated addition polymerizable group per molecule, and (iii) an organic polyol with a minimum molecular weight of 500 and at least two free hydrogen containing groups capable of polymerizing with isocyanate groups. For a description of some of these materials see U.S. Pat. No. 5,015,556.

The photopolymerizable composition contains at least one compound capable of addition polymerization that is compatible with the binder to the extent that a clear, non-cloudy photosensitive layer is produced. The at least one compound capable of addition polymerization may also be referred to as a monomer and can be a single monomer or mixture of monomers. Monomers that can be used in the photopolymerizable composition are well known in the art and include, but are not limited to, addition-polymerization ethylenically unsaturated compounds with at least one terminal ethylenic group. Generally the monomers have relatively low molecular weights (less than about 30,000). Preferably, the monomers have a relatively low molecular weight less than about 5000. Examples of suitable monomers include, but are not limited to, t-butyl acrylate, lauryl acrylate, the acrylate and methacrylate mono- and poly-esters of alcohols and polyols such as alkanols, such as hexanediol diacrylate and hexanediol dimethacrylate; alkylene glycols, such as ethylene glycol diacrylate, ethylene glycol dimethacrylate, and diethylene glycol diacrylate; trimethylol propane, such as trimethylol propane triacrylate; ethoxylated trimethylol propane; pentaerythritol; dipentaerythritol; polyacrylol oligomers, and the like. If a polyacrylol oligomer is used, the oligomer should preferably have a molecular weight greater than 1000. A mixture of monofunctional and multifunctional acrylates or methacrylates may be used. Other examples of suitable monomers include acrylate and methacrylate derivatives of isocyanates, esters, epoxides and the like. Monomers can be appropriately selected by one skilled in the art to provide elastomeric property to the photopolymerizable composition. Examples of elastomeric monomers include, but are not limited to, acrylated liquid polyisoprenes, acrylated liquid butadienes, liquid polyisoprenes with high vinyl content, and liquid polybutadienes with high vinyl content, (that is, content of 1-2 vinyl groups is greater than 20% by weight).

Further examples of monomers can be found in Chen U.S. Pat. No. 4,323,636; Fryd et al., U.S. Pat. No. 4,753,865; Fryd et al., U.S. Pat. No. 4,726,877 and Feinberg et al., U.S. Pat. No. 4,894,315. The compound capable of addition polymerization (monomer) is present in at least an amount of 5%, preferably 10 to 20%, by weight of the elastomeric composition.

The photoinitiator can be any single compound or combination of compounds which is sensitive to actinic radiation, generating free radicals which initiate the polymerization of the monomer or monomers without excessive termination. Any of the known classes of photoinitiators, particularly free radical photoinitiators such as quinones, benzophenones, benzoin ethers, aryl ketones, peroxides, biimidazoles, benzyl dimethyl ketal, hydroxyl alkyl phenyl acetophone, dialkoxy actophenone, trimethylbenzoyl phosphine oxide derivatives, aminoketones, benzoyl cyclohexanol, methyl thio phenyl morpholino ketones, morpholino phenyl amino ketones, alpha halogeno acetophenones, oxysulfonyl ketones, sulfonyl ketones, oxysulfonyl ketones, benzoyl oxime esters, thioxanthones, camphorquinones, ketocoumarins, Michler's ketone may be used. Alternatively, the photoinitiator may be a mixture of compounds, one of which provides the free radicals when caused to do so by a sensitizer activated by radiation. Preferably, the initiator is sensitive to visible or ultraviolet radiation. Photoinitiators are generally present in amounts from 0.001% to 10.0% based on the weight of the photopolymerizable composition.

Optionally, the photopolymerizable layer can contain spectral sensitizing agents. In general, spectral sensitizing agents are those materials that absorb radiation at a wavelength different than that of the reaction-initiating component, i.e., photoinitiator, and are capable of transferring the absorbed energy to the photoinitiator. Thus, the wavelength of the activating radiation can be adjusted.

The photopolymerizable layer can contain other additives depending on the final properties desired. Additional additives to the photopolymerizable layer include sensitizers, plasticizers, rheology modifiers, thermal polymerization inhibitors, colorants, processing aids, antioxidants, antiozonants, UV absorber and fillers. Processing aids may be such things as low molecular weight polymers compatible with the elastomeric block copolymer, such as low molecular weight alpha-methylstyrene polymer or copolymer. Antiozonants include hydrocarbon waxes, norbornenes, and vegetable oils. Suitable antioxidants include alkylated phenols, alkylated bisphenols, polymerized trimethyldihydroquinone, and dilauryl thiopropinoate.

Plasticizers are used to adjust the film forming properties of the elastomer. Examples of suitable plasticizers include aliphatic hydrocarbon oils, e.g., naphthenic and paraffinic oils; liquid polydienes, e.g., liquid polybutadiene; and liquid polyisoprene. Generally, plasticizers are liquids having molecular weights of less than about 5000, but can have molecular weights up to about 30,000. Plasticizers having low molecular weight will encompass molecular weights less than about 30,000.

Particularly preferred photosensitive elements that include a photopolymerizable layer having specific rheological properties are disclosed by Mengel et al. in PCT publication WO 01/88615 A1.

Flexographic printing plates formed from photopolymerizable compositions which are soluble, swellable, or dispersible in aqueous, semi-aqueous, or organic solvent developers (so called wet development) may also be suitable for use in the present invention to the extent that the photopolymerizable composition is also capable of liquefying upon thermal development to form a relief surface. Examples of suitable compositions for solvent development have been disclosed, for example, in Chen et al., U.S. Pat. No. 4,323,637, Gruetzmacher et al., U.S. Pat. No. 4,427,749 and Feinberg et al., U.S. Pat. No. 4,894,315.

The thickness of the photopolymerizable layer can vary over a wide range depending upon the type of printing plate desired, for example, from about 0.010 inches to about 0.250 inches or greater (about 0.025 cm to about 0.64 cm or greater). For so-called "thin plates" typically the photopolymerization layer can range from about 0.010 inches to about 0.067 inches (about 0.025 cm to about 0.17 cm) in thickness.

The support can be any material that is conventionally used with photosensitive elements used to prepare flexographic printing plates. The support may be cylindrically shaped itself, or as was explained above, for plates-on-sleeves may be planar and mounted onto a cylindrical support, or may be planar sheet of a photosensitive plate formed into a cylinder by securing the end edges together by any method. Preferably the support is transparent to actinic radiation to accommodate "backflash" exposure through the support. Examples of suitable support materials include polymeric films such those formed by addition polymers and linear condensation polymers, transparent foams and fabrics. Under certain end-use conditions metals, such as aluminum, may also be used as a support, even though a metal support is not transparent to radiation. A preferred support is a polyester film; particularly preferred is polyethylene terephthalate. The support may be in sheet form or in cylindrical form, such as a sleeve. The type of sleeve or cylindrical support is not limited by the present invention. The sleeve may be formed from single layer or multiple layers of flexible material. Flexible sleeves made of polymeric films are preferred, as they typically are transparent to ultraviolet radiation and thereby accommodate backflash exposure for building a floor in the cylindrical printing element. Multiple layered sleeves may include an adhesive layer or tape between the layers of flexible material. An example of a multiple layered sleeve is disclosed in U.S. Pat. No. 5,301,610. The sleeve may also be made of non-transparent, actinic radiation blocking materials, such as nickel or glass epoxy. The support typically has a thickness from 0.002 to 0.050 inch (0.0051 to 0.127 cm). A preferred thickness for the sheet form is 0.003 to 0.016 inch (0.0076 to 0.040 cm). The sleeve can have a wall thickness from less than 10 mils (0.025 cm) to 80 mils (0.203 cm) or more, but typically has a wall thickness of 10 to 40 mils (0.025 to 0.10 cm). Generally, a preferred wall thickness is dependent upon the desired end-use conditions.

The photopolymerizable layer itself can be prepared in many ways by admixing the binder, monomer, initiator, and other ingredients. It is preferred that the photopolymerizable mixture be formed into a hot melt and then calendered to the desired thickness. An extruder can be used to perform the functions of melting, mixing, deaerating and filtering the composition. The extruded mixture is then calendered between the support and a temporary coversheet. Alternatively, the photopolymerizable material can be placed between the support and the temporary coversheet in a mold. The layers of material are then pressed flat by the application of heat and/or pressure.

The preparation and formation of cylindrical seamless or substantially seamless photopolymerizable elements is not limited, and may be prepared for example, according to the methods and apparatuses disclosed by Cushner et al. in U.S. Pat. No. 5,798,019 and U.S. Pat. No. 5,916,403; Arimatsu in U.S. Pat. No. 4,337,220; Kitamura et al. in U.S. Pat. No. 4,868,090; Koch et al. in U.S. Pat. No. 4,869,997; Wallbillich et al. in U.S. Pat. No. 4,871,650 and U.S. Pat. No. 4,883,742; Fan et al. in U.S. Pat. No. 6,425,327; and Rossini et al. in U.S. Publication No. US 2002/0069777 A1. A seamless photopolymerizable layer means that the photopolymerizable layer is a continuum of photopolymeric material whereby no line of demarcation or joining of the photopolymeric material as a layer or other defect influencing print quality is present at least on exterior circumferential surface, i.e., printing surfaces, of the element. Preferably, the layer of photopolymeric material is continuous throughout the thickness of the layer, i.e., radially from the surface of the support to the exterior surface of the photopolymerizable layer, and along an axial length of the element. An example of a seamless photopolymerizable printing form is disclosed by Fan et al. in EP 0 766 142 A1. In addition, the photopolymerizable flat sheet elements can be reprocessed by cutting the element to wrap around the cylindrical support, (usually the printing sleeve), so that the edges contact without any gaps or overlapping, and fusing or joining the edges together to form a continuous cylindrical element. In yet another embodiment, the edges of the photopolymerizable flat sheet element can be butt joined by methods including, but not limited to, melt fusing, taping, stitching, clamping, stapling, taping, and gluing, to fuse or join the edges together to form a cylindrical element. Depending upon customer needs, after thermal development of the butt joined cylindrical form, the butt joined portion can be cut away and then mounted as a (planar) plate onto a printing cylinder. Alternatively, the photopolymerizable flat sheet element can be precision cut and registered when butt joining so that after thermal development the resulting cylindrical element can be mounted as is onto a printing cylinder (with or without a compressible print adapter sleeve between the printing cylinder and the cylindrical form). Processes for joining the edges of a plate in into a cylindrical form have been disclosed, for example, in German patent DE 28 44 426, United Kingdom Patent GB 1 579 817, and U.S. Pat. No. 4,758,500.

Additional layers may be present on top of the photopolymerizable layer, that is, on a side of the photopolymerizable layer opposite the support. These layers may comprise at least one thermally removable layer on the photopolymerizable layer, such as disclosed by Fan et al. in U.S. Pat. No. 6,773,859 B2. Depending on desired use, the additional layers may be opaque or transparent to actinic radiation. They may have one or more functions for the photosensitive element including, but not limited to, a release layer, an actinic radiation opaque layer, a barrier layer, an adhesion modifying layer, and a layer which alters the surface characteristics of the photosensitive element.

Suitable layers are those disclosed as elastomeric layers in the multilayer cover element described in U.S. Pat. No. 4,427,759 and U.S. Pat. No. 4,460,675. Such elastomeric layers comprise layers which are insensitive to actinic radiation themselves but become photosensitive when contacted with the photopolymerizable layer as well as such layers which are photosensitive themselves. These photosensitive elastomeric layers include an elastomeric binder, a monomer, and a photoinitiator, and optionally fillers or other additives. Elastomeric layers that become photosensitive when contacted with the photopolymerizable layer do not comprise any monomer. Binder, monomer, and other compounds can be the same or similar to those compounds comprised in the photopolymerizable layer. These elastomeric layers are disposed above the photopolymerizable layer.

In one embodiment the photosensitive element comprises an infrared (IR)-sensitive layer on top of the photopolymerizable layer or on top of the elastomeric layer if present. The IR-sensitive layer can form an integrated masking layer for the photosensitive element. The preferred IR-sensitive layer is opaque to actinic radiation that is, has an optical density $\geqq 2.5$; can be imaged, preferably by ablating, with an infrared laser; and removable during treating, i.e., soluble or dispersible in a developer solution or during thermal development. The IR sensitive layer contains material having high absorption in the wavelength (infrared0 range between 750 and 20,000 nm, such as, for example, polysubstituted phthalocyanine compounds, cyanine dyes, merocyanine dyes, etc., inorganic pigments, such as, for example, carbon black, graphite, chromium dioxide, etc., or metals, such as aluminum, copper, etc. The quantity of infrared absorbing material is usually 0.1-40% by weight, relative to the total weight of the layer. To achieve the optical density of $\geqq 2.5$ to block actinic radiation, the infrared-sensitive layer contains a material that prevents the transmission of actinic radiation. This actinic radiation blocking material can be the same or different than the infrared absorbing material, and can be, for example, dyes or pigments, and in particular the aforesaid inorganic pigments. The quantity of this material is usually 1-70% by weight relative to the total weight of the layer. The infrared-sensitive layer optionally includes a polymeric binder, such as, for example, nitrocellulose, homopolymers or copolymers of acrylates, methacrylates and styrenes, polyamides, polyvinyl alcohols, etc. Other auxiliary agents, such as plasticizers, coating aids, etc. are possible. The infrared-sensitive layer is usually prepared by coating or printing a solution or dispersion of the aforesaid components as a layer on the cover sheet, and subsequently drying it before applying the cover sheet to the top of the photopolymerizable layer. The thickness of the infrared-sensitive layer is usually 2 nm to 50 µm, preferably 4 nm to 40 µm. These infrared-sensitive layers and their preparation are described in detail, for example in WO 94/03838 and WO 94/3839.

Furthermore, the photosensitive element may optionally comprise a release layer on top of the photopolymerizable layer or on top of the elastomeric layer if present. The release layer enables the easy removal of a mask used for the imagewise exposure of the photosensitive element. The release layer must be flexible, transparent, and non-tacky. It is usually a thin layer, preferably having a thickness of at least 0.5 microns, but less than 10 microns, more preferably less than 4 microns. The release layer preferably is removable during the normal development process. Suitable release layers may include polyamides, polyvinyl alcohols, polyurethanes, polyvinyl pyrrolidones, amphoteric interpolymers, hydroxy cellulosic polymers, polyethylene oxides, copolymers of ethylene and vinyl acetate, and combinations thereof. Optionally, the release layer may comprise inorganic or organic matting agents, colorants, e.g., dyes and/or pigments as well as photochromic additives, i.e., for identification or for better contrast between imaged and non-imaged areas of the photosensitive elements directly after imagewise exposure or after imagewise exposure and development. Especially release layers comprising matting agents capable of being anchored in the surface of the photopolymerizable layer are suitable like those described in WO 03/079114.

The photosensitive element can optionally include a wax layer as disclosed in DE-C 199 09 152 or a barrier layer between the IR-sensitive layer and the photopolymerizable layer, or between the IR-sensitive layer and the elastomeric layer if present. Suitable waxes are all natural and synthetic waxes, such as polyolefin waxes, paraffin waxes, carnauba waxes, stearin waxes, and steramide waxes. Preferred are waxes with a softening temperature $\geqq 70°$ C., especially polyethylene waxes having a softening temperature $\geqq 90°$ C. Conventional methods like casting, printing, or spray coating are used to prepare the wax layers from dispersions of the waxes in suitable solvents. The wax layer is usually 0.02-1.0 µm thick, preferably 0.05-0.5 µm. In the case of an IR sensitive layer being present in the photosensitive element, the barrier layer may be placed between the photopolymerizable layer or the elastomeric layer and the IR sensitive layer. Materials suitable as the release layer described above, are also suitable as the barrier layer as described in U.S. Pat. Nos. 5,262,275 and 5,719,009.

The photosensitive element can optionally include an adhesive layer between the support and the photopolymerizable layer. Such adhesive materials are disclosed in U.S. Pat. Nos. 3,036,913 or 2,760,863. Alternatively, the support can have an adhesion promoting surface by flame-treatment or electron-treatment or the adhesion of the photopolymerizable layer to the support can be enhanced by exposure to actinic radiation through the support.

Furthermore, the photosensitive element can optionally include an antihalation layer between the support and the photopolymerizable layer. Such antihalation layer can be made by dispersing a finely divided dye or pigment which substantially absorbs actinic radiation in a solution or aqueous dispersion of a resin or polymer which is adherent to both the support and the photopolymerizable layer and coating it on the support and drying. Suitable antihalation pigments and dyes include carbon black, manganese dioxide, Acid Blue Black (CI 20470), and Acid Magenta O (CI 42685). Suitable polymeric or resin carriers include polyvinyl compounds, e.g., polyvinyl chloride homo- and copolymers, copolymers of acrylic and methacrylic acid, etc.

The photosensitive element optionally comprises a temporary cover sheet on top of the outermost layer of the photosensitive element. Useful cover sheets consist of flexible polymeric films, e.g., polystyrene, polyethylene, polypropylene, polycarbonate, fluoropolymers, polyamide or polyesters. Preferably, polyesters are used, especially polyethylene terephthalate. Mostly, the cover sheet is unsubbed, but optionally may be subcoated with a thin silicone layer.

Before thermal treatment according to the present invention, the photosensitive element is exposed to actinic radiation. Upon imagewise exposure, the radiation-exposed areas of the photopolymerizable layer are converted to the insoluble state with no significant polymerization or crosslinking taking place in the unexposed areas of the layer. Any conventional source of actinic radiation can be used for this exposure. Examples of suitable radiation sources include xenon lamps, mercury vapor lamps, carbon arcs, argon glow lamps, fluorescent lamps with fluorescent materials emitting UV radiation and electron flash units, and photographic flood lamps. Typically, a mercury vapor arc or a sunlamp can be used at a distance of about 1.5 to about 60 inches (about 3.8 to about 153 cm) from the photosensitive element. These radiation sources generally emit long-wave UV radiation between 310-400 nm. The exposure time may vary from a few seconds to minutes, depending upon the intensity and spectral energy distribution of the radiation, its distance from the photosensitive element, and the nature and amount of the photopolymerizable material.

Imagewise exposure can be carried out by exposing the photosensitive element through an image-bearing photomask. The photomask can be a separate film, i.e., an image-bearing transparency or phototool, such as a silver halide film; or the photomask can be integrated with the photosensitive element as described above. In the case in which the photomask is a separate film, the optional cover sheet is usually stripped before imagewise exposure leaving the release layer on the photosensitive element. The photomask is brought into close contact with the release layer of the photosensitive element by the usual vacuum processes, e.g., by use of a common vacuum frame. Thus a substantially uniform and complete contact between the photosensitive element and the photomask can be achieved in acceptable time.

It is preferred to form the integrated photomask on the cylindrical photosensitive element. In a particularly preferred embodiment, the photosensitive element includes the IR-sensitive layer which becomes the integrated photomask. The IR-sensitive layer is imagewise exposed to IR laser radiation to form the photomask on the photosensitive element. The infrared laser exposure can be carried out using various types of infrared lasers, which emit in the range 750 to 20,000 nm. Infrared lasers including, diode lasers emitting in the range 780 to 2,000 nm and Nd:YAG lasers emitting at 1064 nm are preferred. In so-called digital imaging, the radiation opaque layer is exposed imagewise to infrared laser radiation to form the image on or disposed above the photopolymerizable layer, i.e., the in-situ mask. The infrared laser radiation can selectively remove, e.g., ablate or vaporize, the infrared sensitive layer (i.e., radiation opaque layer) from the photopolymerizable layer, as disclosed by Fan in U.S. Pat. Nos. 5,262,275 and 5,719,009; and Fan in EP 0 741 330 B1. The integrated photomask remains on the photosensitive element for subsequent steps of UV pre-exposure, imagewise main exposure to actinic radiation and development.

In an alternate embodiment of digital method of mask formation, the photosensitive element will not initially include an infrared sensitive layer. In this case the infrared sensitive layer is the same as or substantially the same as the infrared sensitive layer included with the photosensitive layer as described above. A separate element bearing the infrared sensitive layer will form an assemblage with the photosensitive element such that the infrared sensitive layer is adjacent the surface of the photosensitive element opposite the support, which is typically the photopolymerizable layer. The separate element may include one or more other layers, such as ejection layers or heating layers, to aid in the digital exposure process. The assemblage is exposed imagewise with infrared laser radiation to selectively transfer the infrared sensitive layer and form the image on or disposed above the photopolymerizable layer as disclosed by Fan et al. in U.S. Pat. No. 5,607,814; and Blanchett in U.S. Pat. Nos. 5,766,819; 5,840,463; and EP 0 891 877 A. Only the portions of the infrared sensitive layer which were transferred will reside on the photosensitive element forming the in situ mask.

Further, the mask image may be created on a separate carrier and then transferred by application of heat and/or pressure to the surface of the photopolymerizable layer opposite the support. The photopolymerizable layer is typically tacky and will retain the transferred image. The separate carrier can then be removed from the element prior to the pre-exposure and/or the imagewise exposure. The separate carrier may have an infrared sensitive layer that is imagewise exposed to laser radiation to selectively remove the material and form the image. An example of this type of carrier is LaserMask® imaging film by Rexam, Inc.

It is also contemplated that digital mask formation can be accomplished by imagewise application of the radiation opaque material in the form of inkjet inks. Imagewise application of an inkjet ink can be directly on the photopolymerizable layer or disposed above the photopolymerizable layer of the photosensitive element.

An overall back exposure through the support may be conducted before, after or during, preferably after, the imagewise exposure to polymerize a predetermined thickness of the photopolymer layer adjacent the support. This polymerized portion of the photopolymer layer is designated a floor. The floor provides improved adhesion between the photopolymerizable layer and the support, helps highlight dot resolution and also establishes the depth of the plate relief. The floor thickness varies with the time of exposure, exposure source, etc. This exposure may be with diffuse or directed radiation. All radiation sources suitable for imagewise main exposure may be used. The exposure is generally for 1-30 minutes.

Following imagewise exposure to actinic radiation through the mask and removal of the photomask if it is a separate film, the photosensitive printing element is thermally treated to remove unpolymerized areas in the photopolymerizable layer and thereby form a relief image. The thermal treating step removes at least the photopolymerizable layer in the areas that were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerised areas of the photopolymerizable layer. For photosensitive elements including a separate IR-sensitive layer for digital formation of the mask, the treating step that forms the relief image in the photopolymerizable layer may also remove the mask image (which had been exposed to actinic radiation).

Treating the element thermally includes heating the photosensitive element having at least one composition layer, that is at least one photopolymerizable layer, (and the additional layer/s) to a temperature sufficient to cause the uncured portions of the photopolymerizable layer to soften or melt or flow. The exterior surface of the composition layer of the photosensitive element is heated to a temperature sufficient to cause a portion of the layer to liquefy. The thermal development process is conducted typically with more than one cycle of heating the element and contacting the element with the development medium in order to remove the uncured polymer to a suitable relief depth because uncured portions of the composition layer may only partially liquefy upon heating. In a preferred embodiment, treating also includes contacting an outermost surface of the element to an absorbent surface to absorb or wick away the melt or flow portions. The polymerized areas of the photopolymerizable layer have a higher melting temperature than the unpolymerized areas and therefore do not melt, soften, or flow at the thermal development temperatures. Thermal development of photosensitive elements to form flexographic printing plates is described by Martens in U.S. Pat. Nos. 5,015,556; 5,175,072; 5,215,859; and by Wang et al. in WO 98/13730.

The term "melt" is used to describe the behavior of the unirradiated portions of the photopolymerizable elastomeric layer subjected to an elevated temperature that softens and reduces the viscosity to permit flow and absorption by the development medium. The material of the meltable portion of the photopolymerizable layer is usually a viscoelastic material which does not have a sharp transition between a solid and a liquid, so the process functions to absorb the heated composition layer at any temperature above some threshold for absorption in the absorbent material. A wide temperature range may be utilized to "melt" the composition layer for the purposes of this invention. Absorption may be slower at lower temperatures and faster at higher temperatures during successful operation of the process.

The thermal treating steps of heating the photosensitive element and contacting an outermost surface of the element with development medium can be done at the same time, or in sequence provided that the uncured portions of the photopolymerizable layer are still soft or in a melt state when contacted with the development medium. The at least one photopolymerizable layer (and the additional layer/s) are heated by conduction, convection, radiation, or other heating methods to a temperature sufficient to effect melting of the uncured portions but not so high as to effect distortion of the cured portions of the layer. The one or more additional layers disposed above the photopolymerizable layer may soften or melt or flow and be absorbed as well by the absorbent material. The photosensitive element is heated to a surface temperature above about 40° C., preferably from about 40° C. to about 230° C. (104-446° F.) in order to effect melting or flowing of the uncured portions of the photopolymerizable layer. By maintaining more or less intimate contact of the development medium with the photopolymerizable layer that is molten in the uncured regions, a transfer of the uncured photosensitive material from the photopolymerizable layer to the development medium takes place. While still in the heated condition, the development medium is separated from the cured photopolymerizable layer in contact with the support layer to reveal the relief structure. A cycle of the steps of heating the photopolymerizable layer and contacting the molten (portions) layer with an absorbent material can be repeated as many times as necessary to adequately remove the uncured material and create sufficient relief depth. However, it is desirable to minimize the number of cycles for suitable system performance, and typically the photopolymerizable element is thermally treated for 5 to 15 cycles. Intimate contact of the development medium to the photopolymerizable layer (while the uncured portions are melt) may be maintained by pressing the layer and the development medium together.

The development medium may also be referred to as absorbent material, web, and continuous web. The development medium is selected having a melt temperature exceeding the melt temperature of the uncured portions of the photopolymerizable layer and having good tear resistance at the same operating temperatures. Preferably, the selected material withstands the temperatures required to process the photosensitive element during heating. The development medium is selected from non-woven materials, paper stocks, fibrous woven material, open-celled foam materials, porous materials that contain more or less a substantial fraction of their included volume as void volume. The development medium can be in web or sheet form. The development medium should also possess a high absorbency for the molten elastomeric composition as measured by milligrams of elastomeric composition that can be absorbed per square centimeter of the development medium. Preferred is a non-woven web.

It is also contemplated that the photosensitive element may undergo one or more treating steps to sufficiently remove the uncured portions to form the relief. The photosensitive element may undergo both wet development and dry development, in any order, to form the relief. A pre-development treating step may be necessary to remove one or more of the additional layers disposed above the photopolymerizable layer if such additional layers are not removable by the washout solution and/or by heating.

After the development step, the photosensitive element can be uniformly post-exposed to ensure that the photopolymerization process is complete and that the so formed flexographic printing plate will remain stable during printing and storage. This post-exposure step can utilize the same radiation source as the imagewise main exposure. Furthermore, if the surface of the flexographic printing plate is still tacky, detackification treatments may be applied. Such methods, which are also called "finishing", are well known in the art. For example, tackiness can be eliminated by a treatment of the flexographic printing plate with bromine or chlorine solutions. Preferably, detackification is accomplished by exposure to UV radiation sources having a wavelength not longer than 300 nm. This so-called "light-finishing" is disclosed in European Published Patent Application 0 017927 and U.S. Pat. No. 4,806,506. Various finishing methods may also be combined. Typically, the post-exposure and the finishing exposure are done at the same time on the photosensitive element using an exposure device that has both sources of radiation.

What is claimed is:

1. A process for forming a printing form from a photosensitive element comprising a cylindrical support and a composition layer on the support opposite an interior surface of the support, the composition layer capable of being partially liquefied, comprising:
    supporting the photosensitive element by contacting a first part of the interior surface of the cylindrical support with a first support member, and by contacting a second part of the interior surface of the cylindrical support different from the first part with a second support member, wherein the cylindrical support has one or more unsupported parts between the first part and the second part; and
    treating an exterior surface of the photosensitive element opposite the support to form a relief surface.

2. The process of claim 1 further comprising heating the composition layer to a temperature sufficient to cause a portion of the layer to liquefy.

3. The process of claim 1 wherein the treating comprises contacting a development medium to the exterior surface.

4. The process of claim 3 wherein the contacting comprises supplying the development medium to the exterior surface of the element.

5. The process of claim 3 wherein the contacting comprises delivering the exterior surface of the element to the development medium.

6. The process of claim 3 wherein the contacting of the development medium to the exterior surface is adjacent the first support member.

7. The process of claim 3 further comprising separating the photosensitive element from the development medium.

8. The process of claim 2 further comprising pressing the photosensitive element and a development medium into contact at a pressure sufficient for at least a portion of the liquefied material to be absorbed by the development medium.

9. The process of claim 1 further comprising heating the composition layer to a temperature sufficient to cause a portion of the layer to liquefy and wherein the treating is selected from the group consisting of air stream, liquid stream, and vacuum.

10. The process of claim 1 wherein the first part and the second part are opposite or substantially opposite each other.

11. The process of claim 1 further comprising providing relative movement between the first support member and the second support member.

12. The process of claim 1 wherein the first support member is stationary and the second support member is movable relative to the first support member.

13. The process of claim 1 further comprising moving the second support member.

14. The process of claim 1 further comprising tensioning the cylindrical support between the first support member and the second support member.

15. The process of claim 1 further comprising providing relative movement between the first support member and a supplying member for a development medium.

16. The process of claim 1 wherein the photosensitive element has an axial length and the first support member supports the first part along the axial length of the element.

17. The process of claim 1 wherein the photosensitive element has an axial length and the second support member supports the second part along the axial length.

18. The process of claim 1 wherein the first support member comprises a roller.

19. The process of claim 18 further comprising rotating the roller.

20. The process of claim 18 wherein the roller is an air-shaft having radial passages for supplying air to an outer circumferential surface of the roller.

21. The process of claim 20 further comprising mounting an adapter sleeve to the air-shaft.

22. The process of claim 21 wherein the adapter sleeve comprises a resilient layer.

23. The process of claim 21 wherein the adapter sleeve comprises a resilient layer as an outermost circumferential surface.

24. The process of claim 1 wherein the second support member has an outer surface having an arcuate shape contacting the second part.

25. The process of claim 1 wherein the second support member is selected from the group consisting of a roller and a platform member.

26. The process of claim 1 wherein the second support member comprises a platform member having an arcuate outer surface.

27. The process of claim 26 wherein the outer surface of the platform member has a fixed curvature.

28. The process of claim 26 wherein the outer surface of the platform member has a changeable curvature that can conform or substantially conform to a curvature of the interior surface of the cylindrical support.

29. The process of claim 26 wherein the platform member is segmented in at least two parts that are flexibly coupled together.

30. The process of claim 24 wherein the outer surface of the second means for supporting is a layer of a reduced friction material.

31. The process of claim 1 further comprising supplying a development medium to the exterior surface of the element with a supplying member, wherein the supplying member is selected from the group consisting of a roll, and a non-cylindrical supplying member having a cross-sectional shape selected from the group consisting of elliptical, arcuate, parabolic, semi-circular, wedge, triangular, rectangular, and polygonal shapes.

32. The process of claim 1 further comprising heating the composition layer to a temperature sufficient to cause a portion of the layer to liquefy, wherein the heating is selected from the group consisting of
 a first heating for applying heat to the exterior surface of the composition layer adjacent where a development medium contacts the layer;
 a second heating for heating a supplying member supporting the development medium to a temperature capable of heating the exterior surface of the composition layer while the development medium is contacting the exterior surface of the layer;
 a third heating for heating a first support member contacting the first part to a temperature capable of heating the exterior surface of the composition layer;
 a combination of the first heating and the second heating;
 a combination of the first heating and the third heating;
 a combination of the second heating and the third heating; and
 a combination of the first heating, the second heating, and the third heating;
 wherein the first heating, the second heating, and the third heating, individually or in the above combinations, is capable of heating the exterior surface of the composition layer sufficiently to cause a portion of the layer to liquefy.

33. The process of claim 32 wherein the first heating comprises an infrared heating device.

34. The process of claim 32 further comprising sensing at least one of the temperatures of the first heating, the second heating, and the third heating, and controlling to maintain the at least one sensed temperature at predetermined temperature.

35. The process of claim 31 wherein the heating is a combination of the first heating and the second heating.

36. The process of claim 1 further comprising cooling the photosensitive element.

37. The process of claim 36 wherein the cooling is selected from the group consisting of
 a first cooling for cooling the first support member;
 a second cooling for cooling the second support member; and
 a combination of the first cooling and the second cooling.

38. The process of claim 1 wherein the second support member includes a cavity for transporting a temperature controlled fluid.

39. The process of claim 38 wherein the temperature controlled fluid is water.

40. The process of claim 39 wherein the water cools an outer surface of the second support member, and thereby cools the second part of the interior surface of the cylindrical support.

41. The process of claim 39 wherein the water heats an outer surface of the second support member, and thereby heats the second part of the interior surface of the cylindrical support.

42. The process of claim 1 further comprising
 heating the composition layer to a temperature sufficient to cause a portion of the layer to liquefy, and
 contacting a development medium to the exterior surface.

43. The process of claim 42 wherein the first support member is a roller, and the contacting step supplies a web of the development medium with a hot roll.

44. The process of claim 43 further comprising synchronizing a linear speed of the exterior surface of the photosensitive element rotating on the roller with a linear speed of the web transporting on the hot roll.

45. The process of claim 1 further comprising rotating the cylindrical support about the first support member and the second support member.

46. The process of claim 1 the process further comprising heating the composition layer to a temperature sufficient to cause a portion of the layer to liquefy, and contacting a development medium to the exterior surface, wherein the cylindrical support continuously rotates about the first support member and the second support member thereby continuously repeating the steps of heating and contacting.

47. The process of claim 1 further comprising imagewise exposing the photosensitive element to actinic radiation prior to supporting and treating.

48. The process of claim 47 wherein imagewise exposing is through a mask selected from the group consisting of a phototool and an integrated mask.

49. The process of claim 1 further comprising at least one additional exposing selected from the group consisting of exposing through the support of the element to actinic radiation, post-exposing the element to actinic radiation after treating, and finish exposing the element to radiation less than 300 nm.

50. The process of claim 1 wherein the photosensitive element is selected from the group consisting of a continuous photopolymerizable layer on the cylindrical support, one or more photosensitive sheets on the cylindrical support, and a photosensitive plate comprising the composition layer and a base support formed into the cylindrical support.

51. The process of claim 1 further comprising changing at least one of the process parameters selected from the group consisting of a temperature of the first support member, a temperature of the second support member, a temperature of a supplying member supplying the development medium to the exterior surface, pressure between the supplying member and the first support member, and a linear rotation speed of the exterior surface of the photosensitive element, during treating.

52. The process of claim 1 wherein the composition layer is elastomeric, and comprises a binder, at least one monomer and a photoinitiator or photoinitiator system.

53. The process of claim 1 wherein the photosensitive element further comprises at least one additional layer on the composition layer that is capable of being thermally removed during treating, the additional layer being selected from the group consisting of an elastomeric layer capable of becoming photosensitive, a second photosensitive elastomeric layer, a release layer, a wax layer, and an infrared-sensitive mask layer, wherein a surface of the outermost additional layer opposite the composition layer forms the exterior surface of the photosensitive element.

54. The process of claim 1 further comprising forming a cylindrically-shaped photosensitive element by joining opposite ends of a planar photosensitive element to form the cylindrical support.

55. The process of claim 54 wherein the joining step is selected from the group consisting of melt fusing, clamping, stitching, taping, gluing, and stapling.

56. The process of claim 1 wherein after the treating step the process further comprises mounting the printing form onto a printing cylinder.

57. The process of claim 1 wherein after the treating step the process further comprises cutting the cylindrical support to create a planar printing form and mounting the planar printing form onto a printing cylinder.

58. A cylindrical flexographic printing form produced by the process of claim 47.

* * * * *